(12) United States Patent
Breitwisch et al.

(10) Patent No.: US 6,518,614 B1
(45) Date of Patent: Feb. 11, 2003

(54) EMBEDDED ONE-TIME PROGRAMMABLE NON-VOLATILE MEMORY USING PROMPT SHIFT DEVICE

(75) Inventors: Matthew J. Breitwisch, Essex Junction, VT (US); Bomy A. Chen, Ridgefield, CT (US); Chung H. Lam, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,809

(22) Filed: Feb. 19, 2002

(51) Int. Cl.[7] .............................................. H01L 27/108
(52) U.S. Cl. ...................................... 257/298; 257/368
(58) Field of Search ................................... 257/298, 368

(56) References Cited

U.S. PATENT DOCUMENTS

| | | | |
|---|---|---|---|
| 5,315,177 A | 5/1994 | Zagar et al. | |
| 5,343,434 A | 8/1994 | Noguchi | 365/218 |
| 5,450,334 A | 9/1995 | Pulizzi et al. | |
| 5,675,547 A | 10/1997 | Koga | 365/230.03 |
| 5,739,567 A | 4/1998 | Wong | 257/316 |
| 5,834,813 A | 11/1998 | Ma et al. | 257/368 |
| 5,879,990 A | * 3/1999 | Dormans et al. | 257/316 |
| 6,033,957 A | 3/2000 | Burns, Jr. et al. | 438/270 |
| 6,040,218 A | 3/2000 | Lam | 438/259 |
| RE36,952 E | 11/2000 | Zagar et al. | |
| 6,174,759 B1 | 1/2001 | Verhaar et al. | 438/201 |
| 6,222,760 B1 | 4/2001 | Chang | 365/185.01 |

OTHER PUBLICATIONS

Izawa, et al., "Impact of the Gate–Drain Overlapped Device (GOLD) for Deep Submicrometer VLSI", IEEE Transactions on Electron Devices, vol. 35, No. 12, Dec. 1988.
R. Bellens, et al., "Analysis and Optimisation of the Hot-Carrier Degradation Performance of 0.35um Fully Overlapped LDD Devices", IMEC, Kapeldreef 75, B–3001 Leuven, Belgium, pp. 254–259, 1995.
Terrence B. Hook, "Spurious/Drain Underlap of Large Junction Area NFET's", IEEE Transactions on Semiconductor Manufacturing, vol. 12, No. 3, Aug. 1999.

* cited by examiner

*Primary Examiner*—David Nelms
*Assistant Examiner*—Tu-Tu Ho
(74) *Attorney, Agent, or Firm*—Scully, Scott, Murphy & Presser; Mark F. Chadurjian

(57) ABSTRACT

The present invention provides a programmable element that can be programmed using relatively low-voltages (less than about 5 V) for use in one time programmable non-volatile memory storage or other high-density application. The low-voltage programmable element is a field effect transistor (FET) device that includes source and drain elements, which are separated by a channel region, and a gate region, present atop a portion of the channel region. The source and drain elements are not located beneath the gate region and the FET includes no extension implant regions present therein.

9 Claims, 4 Drawing Sheets

EMBEDDED ONE-TIME PROGRAMMABLE NON-VOLATILE MEMORY USING PROMPT SHIFT DEVICE

BACKGROUND OF THE INVENTION

FIELD OF THE INVENTION

The present invention relates to semiconductor integrated circuits (ICs), and more particularly to a low-voltage programmable element that can be used in the implementation of one-time programmable memory storage as well as in other high-density applications.

In the semiconductor industry, it is oftentimes desirable to fabricate a very large-scale integrated (VLSI) circuit which includes a one-time programmable (OTP) non-volatile memory element that can be programmed either during wafer probing or after packaging of the semiconductor die. For example, programming of an OTP non-volatile memory element is used to provide self-contained identification information about an individual IC die or die revision. OTP non-volatile memory can also be used for remapping addresses of defective DRAM (dynamic random access memory) cells so that functional redundant memory cells are addressed instead. OTP non-volatile memory may also provide hard-coded digital trimming data for precision analog elements.

There are several different methods known in the art to implement non-volatile data storage on an IC die. In one method, metallic fuses can be selectively programmed by exceeding a certain current and thereby creating an open circuit in the fuse. This changes the resistance of the metallic fuse from an initial low-resistance to a high-programmed resistance.

In another method, antifuses are selectively programmed by applying a relatively high-programming voltage to break down a dielectric material contacted by two conductive terminals of the antifuse. This permanently changes the resistance presented by the antifuse from a high initial resistance to a low-programmed resistance. The programmed resistance obtained is typically on the order of several 1000 ohms.

In accessing the antifuse for a read operation, the programmed resistance is used, for example, to couple the input capacitance of a logic gate to a high logic level provided by a power supply, or, alternatively, to a low logic level provided by a connection to ground. The time required to charge or discharge the input capacitance of the logic gate is proportional to the product of the programmed resistance of the fuse and the input capacitance of the logic gate.

The required programming voltage of prior art fuses and antifuses to implement OTP non-volatile memory storage is quite high (on the order of 10–12 volts) and oftentimes the high-programming voltages must be routed to other circuits in the IC which are not typically capable of withstanding such high voltages. Moreover, the introduction of high-voltage programmable fuses and antifuses into an IC die may require some redesigns and process modifications in order to avoid damage to the IC die. In some instances, extra processing steps are needed which increase the overall production cost of the IC die. In addition to requiring high-programming voltages, prior art fuses and antifuses occupy a large space on the IC die which detracts from the space were other ICs devices can be formed.

In view of the drawbacks with prior art OTP elements, there is a need for providing a new and improved OTP element that can be programmed using voltages that are less than about 5 V. Moreover, there is a need for providing a low-cost alternative OTP element that can be used for other high-density applications including electronic fuses, field programmable logic devices, encryption coded macros or systems, ROMs, etc.

BRIEF SUMMARY OF THE INVENTION

One object of the present invention is to provide a programmable element which can be used in the implementation of OTP memory storage as well as other high-density applications such as electronic fuses, field programmable logic devices, encryption coded systems or macros, and ROM.

Another object of the present invention is to provide a programmable element which can be programmed using relatively low-programming voltages as compared with the programming voltages that are typically required to program conventional OTP elements such as fuses and antifuses.

A still further object of the present invention is to provide a programmable element which can be fabricated using existing CMOS (Complementary Metal Oxide Semiconductor) fabrication techniques without the need of using extraneous processing steps.

An even further object of the present invention is to provide a programmable element which can be formed in a relatively small space on a surface of an IC die.

These and other objects and advantages are achieved in the present invention by providing a FET as the programmable element in which the source/drain regions are not present beneath the gate region of the FET. This so-called "underlapped" FET device is formed at the same time as the other FET devices of the IC are formed except that a block mask is used to prevent the implantation of source/drain extension regions therein.

Because the inventive underlapped FET device does not include extension implants therein, the inventive underlapped FET device has a higher source-to-drain resistance than most of the other types of FET devices that are present in the IC. The exclusion of the extension implants permits the inventive underlapped FET device to be used as a low-voltage OTP element for those other types of FETs.

Specifically, one aspect of the present invention relates to an integrated circuit chip which comprises a first set of field effect transistors (FETs) having a first source-to-drain resistance and a second set of FETs having underlapped source/drain regions and a second source-to-drain resistance, wherein said second source-to-drain resistance is at least 50% greater than said first source-to-drain resistance and said second set of FETs is programmable.

A further aspect of the present invention relates to an integrated circuit chip which comprises a first set of transistor logic devices that operate at a first supply voltage, a second set of transistor input/output (I/O) devices that operate at a second supply voltage that is greater than the first supply voltage, and a third set of transistor programmable devices that are programmed at said second supply voltage.

The present invention also provides a programmable field effect transistor (FET) device that comprises source and drain elements which are separated by a channel region, and a gate region present atop a portion of said channel region, said source and drain elements are not located beneath said gate region, wherein during programming charge is trapped outside of the channel region.

DETAILED DESCRIPTION OF THE INVENTION

Figure 1:
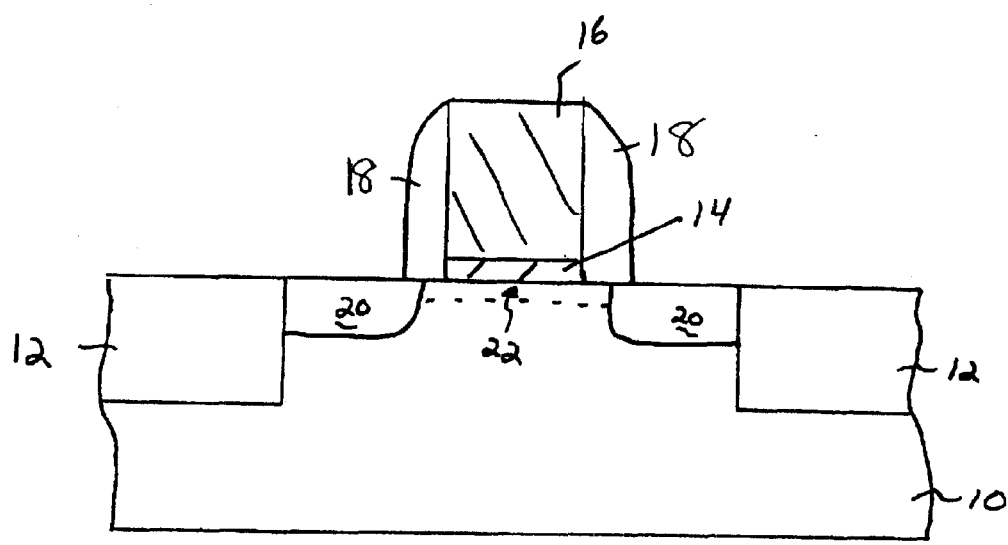
FIG. 1 is pictorial representation (through a cross-sectional view) of the inventive underlapped FET device which can be employed as a low-voltage OTP element.

The present invention, which provides a low-voltage programmable element for an embedded one-time programmable non-volatile memory device, will now be described in more detail by referring to the drawings that accompany the present application.

Reference is first made to FIG. 1 which is a pictorial representation (through a cross-sectional view) showing the inventive OTP element of the present invention. Specifically, the OTP element of the present invention is an underlapped FET which comprises semiconductor substrate 10 having isolation regions 12 located in, or partially within, a surface of substrate 10. The underlapped FET device shown in FIG. 1 also includes gate dielectric 14 present on a portion of substrate 10, gate conductor 16 present atop gate dielectric 14 and spacers 18 present on at least the exposed vertical sidewalls of the gate dielectric and gate conductor. Note spacers 18 include a thin inner spacer and a thicker outer spacer. For clarity, the different spacers are not shown in FIG. 1, but are nevertheless meant to be included within spacer region 18.

Source/drain (S/D) regions 20 are located in the surface of the substrate, and as shown, the S/D regions are not present beneath the gate conductor. The underlapped S/D regions are interconnected by channel region 22 which is located in the substrate beneath the gate region (which is defined by the gate dielectric and the gate conductor). Note that the inventive OTP element shown in FIG. 1 does not contain any extension implant regions formed therein; other FETs (not shown in this drawing) would contain extension implants therein.

During programming of the underlapped FET depicted in FIG. 1 using programming voltages of less than about 5 V, preferably about 3.5 V or less, charge gets trapped outside of the channel region such as in the spacers, not within the channel region as is the case with prior art FETs in which extension implant regions are present beneath the gate region. In the present invention, the underlapped FET is programmed by hot-electron injection into regions of the FET outside the channel region when relatively low-programmable voltages (less than about 5 V) are employed.

The programmable state of the inventive underlapped device can be read using a sense amplifier or other like device which is capable of reading the programmable state of the underlapped device. For clarity, the sense amp is not depicted in the drawings of the present invention.

The underlapped FET device shown in FIG. 1 will have a shift in threshold voltage due to channel hot-electrons injected from the substrate into spacers 18 (and some charge may get trapped in gate dielectric 14) much more readily than overlapped FETs; this shift in threshold voltage is referred to herein as a "prompt shift". The present invention uses this phenomenon to build a very dense memory array without adding any cost to the base CMOS process by blocking the extension implants.

The programming mechanics of the inventive OTP element include the following: Pulse drain and gate voltage to 3.5 V, while grounding the source and substrate to program a "0" state. "1" state is non-programmed state. To read the state, apply 2.5 V to the gate, 50 mV to the drain, ground the source and the substrate and measure the drain current. Note that the foregoing represents one possible way to program the inventive OTP element, and that other ways may also be employed in the present invention.

Figure 2A:
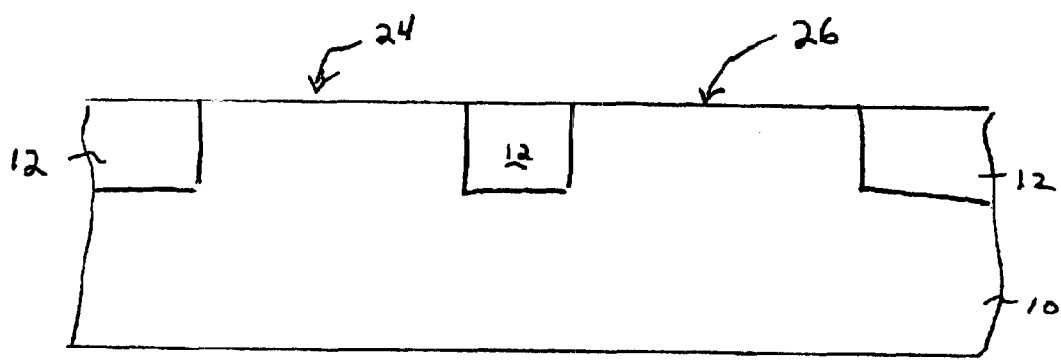
FIGS. 2A–2E are pictorial representations showing the basic processing steps that are employed in fabricating the inventive underlapped FET device.

The structure shown in FIG. 1 is comprised of conventional materials well known to those skilled in the art and it is fabricated using the processing steps which are shown in FIGS. 2A–2E. FIG. 2A shows an initial structure that is employed in fabricating the inventive OTP element shown in FIG. 1. Specifically, FIG. 2A comprises semiconductor substrate 10 which has isolation regions 12 formed therein. The isolation regions electrically isolate various IC devices from other types of IC devices present in the substrate. Specifically, in FIG. 2A, isolation regions 12 separate the active area (labeled as 24) where the inventive OTP element is to be formed from the active area (labeled as 26) where a typically FET is to be formed.

The semiconductor substrate employed in the present invention comprises any conventional semiconducting material, including, but not limited to: Si, Ge, SiGe, GaAs, InAs, InP and all other III/V semiconducting compounds. Layered substrate comprising the same or different semiconducting material, e.g., Si/SiGe, and silicon-on-insulators (SOIs) are also contemplated herein. The substrate may be of the n or p-type depending on the desired device to be fabricated.

Isolation regions 12, which may be local oxidation of silicon isolation (LOCOS) regions or trench isolation regions, are then formed in portions of semiconductor substrate 10 using conventional processes well known to those skilled in the art. For example, LOCOS regions are formed using a conventional LOCOS process in which exposed portions of substrate 10 that are not protected by a patterned nitride layer are thermally oxidized. The patterned nitride layer is then removed using a conventional stripping process that is highly selective in removing nitride as compared to Si.

Trench isolation regions, on the other hand, are formed by first providing a patterned hardmask on the surface of the substrate using conventional deposition, lithography and etching processes well known to those skilled in the art. A timed etching process is then employed which forms trenches of a desired depth into exposed surfaces of the substrate. The trenches may be optionally lined with a liner material prior to filling of the trench with a trench dielectric material such as TEOS (tetraethylorthosilicate) or SiO2. In some instances, the trench dielectric material may be planarized after deposition and/or a conventional densification process may be employed to increase the density of the trench dielectric material. The hardmask used in defining the trenches may be removed anytime after the trenches have been formed in the substrate using a conventional stripping process that is highly selective in removing a hardmask material from the structure. It is noted that in the drawings isolation regions 12 are depicted as trench isolation regions.

Figure 2B:
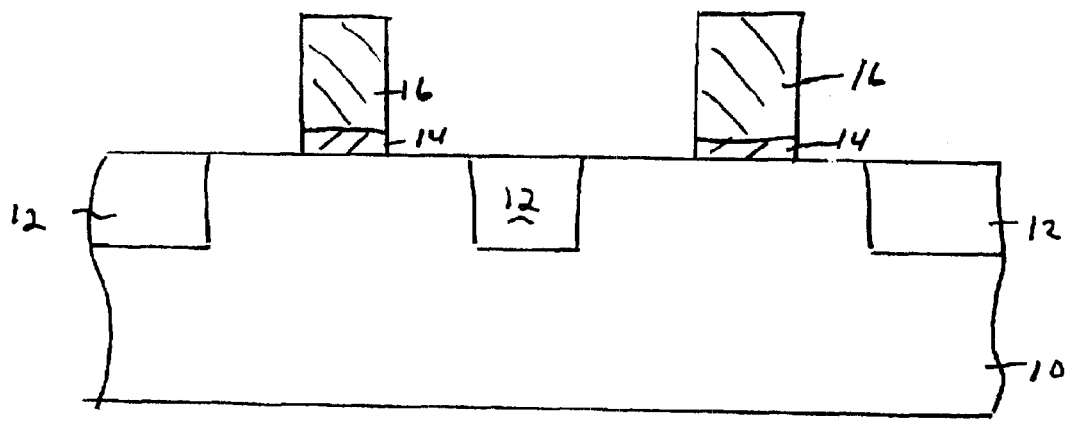

Next, and as depicted in FIG. 2B, a patterned gate region including gate dielectric 14 and gate conductor 16 is then formed on exposed portions of substrate 10 that do not include the isolation regions. Specifically, gate dielectric 14 is formed on the surface of substrate 10 using a conventional deposition process such as chemical vapor deposition (CVD), plasma-assisted CVD, evaporation or chemical solution deposition, or alternatively, gate dielectric 14 is formed by a conventional thermal oxidation process. Gate dielectric 14 is composed of any dielectric material including, but not limited to: an oxide, a nitride, an oxynitride or any combination thereof. The thickness of the gate dielectric may vary and is not critical to the present application. Typically, gate dielectric 14 has a thickness of from about 2.0 to about 10.0 nm, with a thickness of from about 4.0 to about 6.0 nm being more highly preferred. Note that the thickness of the gate dielectric used in forming the inventive underlapped FET may be the same or different than the other FET devices present in the structure.

The gate dielectric may be patterned at this point of the inventive process using conventional lithography and etching, or the gate dielectric may be patterned at a later time, e.g., at the same time as the gate conductor. The latter is preferred since it reduces the number of processing steps required in fabricating the gate region.

Gate conductor 16 is then formed atop gate dielectric 14 using a conventional deposition process such as CVD, plasma-assisted CVD, evaporation, sputtering or chemical solution deposition. The gate conductor is composed of any conductive material including, but not limited to: doped polysilicon; a conductive elemental metal such as W, Pt, Pd, Ru, Rh and Ir; alloys which include at least one conductive elemental metal; suicides or nitrides of at least one of the above-mentioned conductive elemental metals; or any combination thereof. When a combination of conductive materials is employed, an optional diffusion barrier material such as SiN, TaN, TaSiN, WN or TaSi2 may be formed between each of the conductive materials. Note that a polysilicon gate conductor may be formed using a conventional in-situ doping deposition process or, alternatively, the polysilicon gate conductor may be formed by deposition and ion implantation.

The thickness of gate conductor 16 may vary and is not critical to the present invention. Typically, however, gate conductor 16 has a thickness of from about 50 to about 250 nm, with a thickness of from about 150 to about 200 nm being more highly preferred. The gate conductor, and if not previous patterned, the gate dielectric, may be now patterned using conventional lithography and etching. A dielectric cap, such as a nitride cap, not shown, may be formed atop the gate conductor prior to patterning the gate region using conventional processes well known to those skilled in the art.

Figure 2C:
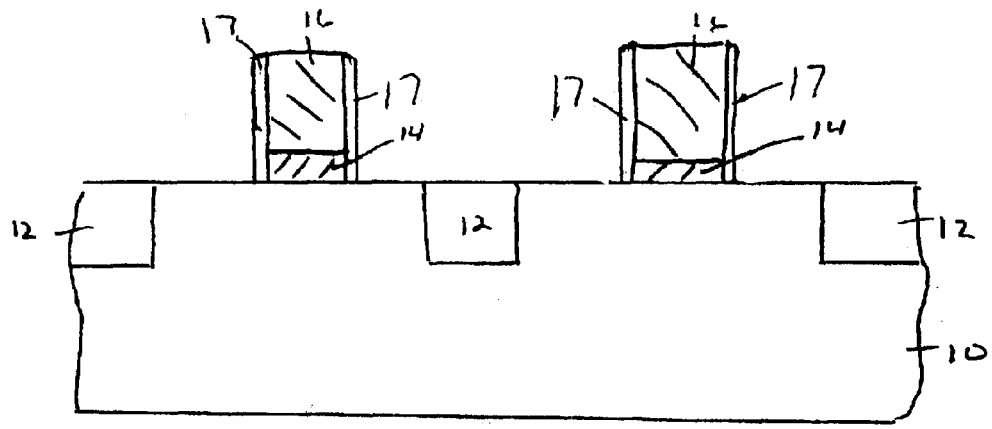

Next, and as shown in FIG. 2C, first spacers 17 which are composed of a conventional insulator such as an oxide, nitride, oxynitride or any combination thereof, are then formed about each patterned gate region so as to protect at least the exposed sidewalls of the gate dielectric and gate conductor. The first spacers are formed using conventional processes well known to those skilled in the art, including, for example, deposition and, optionally, etching. Prior to spacer formation, the exposed sidewalls of the gate dielectric and gate conductor may be subjected to a conventional sidewall oxidation process which forms an oxide region (not shown) on the exposed sidewalls. Note that the first spacers are thin spacers relative to the second spacers used during source/drain implantation.

Figure 2D:
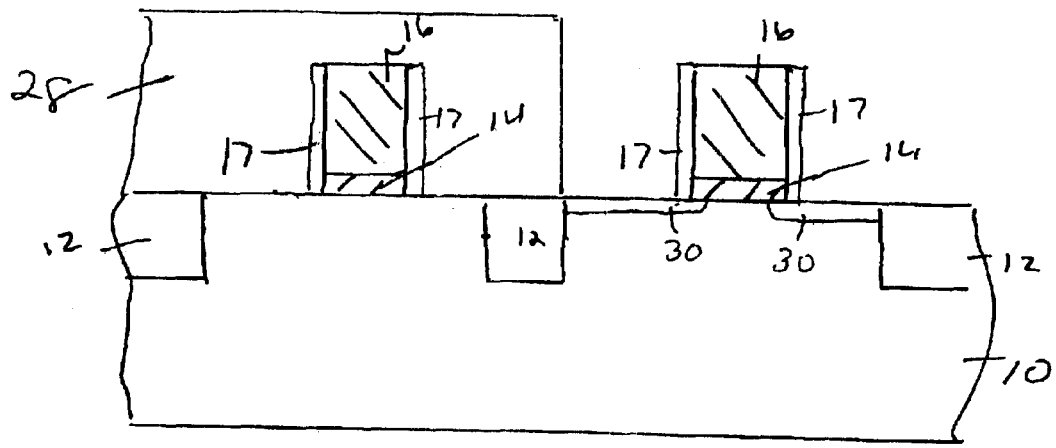

FIG. 2D illustrates the resultant structure that is formed after block mask 28 is formed over portions of the structure in which the inventive underlapped FET devices are to be fabricated, and extension implants 30 are formed in other portions of the structure using a conventional angled implantation process well known to those skilled in the art. The block mask is then removed from the structure after the formation of the extension implant regions using a conventional stripping process well known in the art.

Figure 2E:
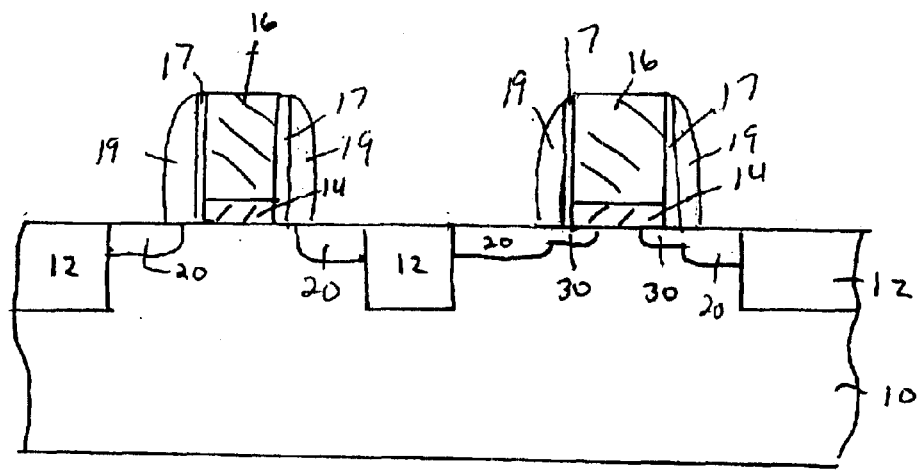

Next, and as shown in FIG. 2E, second spacers 19 which may be composed of the same or different insulator material as the first spacers are formed over first spacers 17 by deposition and etching. Note that second spacers 19 are thicker than the first spacers used for implanting the extension regions into the substrate. In the remaining drawings, i.e., FIGS. 3 and 4, first and second spacers are shown as a single spacer and reference numeral 18 is used in denoting the same.

Next, source/drain regions (or source/drain elements) 20 are formed in substrate 10 about each patterned gate region. The source/drain regions are formed using a conventional ion implantation process followed by an activation annealing process that is performed at a temperature of about 800° C. or higher. Note that in this figure the source/drain regions are not present beneath the gate region in the region which previously included the block mask. Hence, the illustrated FET device is an underlapped device that can be employed as an OTP element.

Because the inventive FET is greatly underlapped, increased hot-electron injection into other regions of the FET beside the channel occurs. In one embodiment, the increased hot-electron injection occurs into the spacers that abut the gate region. The increased hot-electron injection results in a FET device that has a 50% or greater, preferably 100%, increase in the source-to-drain resistance as compared to FETs that contain overlapped source/drain regions.

Figure 3:
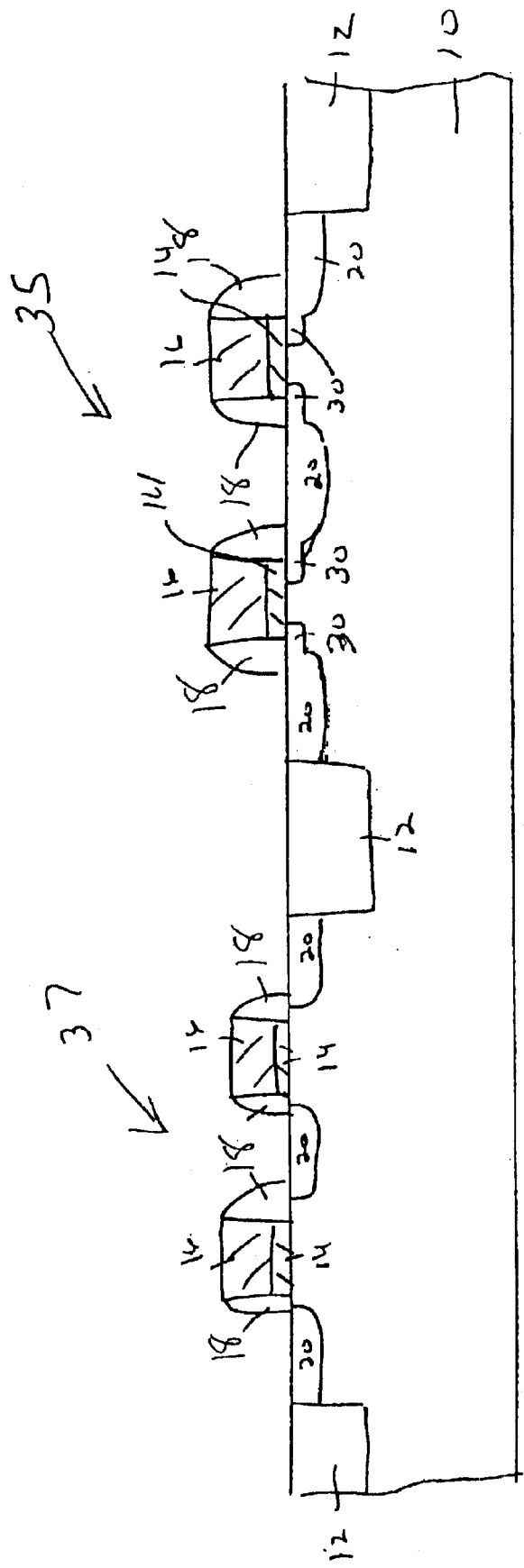
FIG. 3 is a pictorial representation of an IC chip which includes a set of overlapped FETs and a set of the inventive underlapped FETs.

FIG. 3 illustrates one possible structure in which the inventive underlapped FET device can be used. Specifically, FIG. 3 illustrates an IC chip that comprises first set of field effect transistors (FETs) 35 having a first source-to-drain resistance and second set of FETs 37 having a second source-to-drain resistance, wherein the second source-to-drain resistance is at least 50% greater than said first source-to-drain resistance. As shown, the second set of FETs includes the inventive underlapped FETs which are programmable at relatively low-voltages (i.e., less than about 5 V). In some embodiments of the present invention, the source-to-drain resistance is approximately 100% greater for the inventive OTP element as compared to a conventional FET.

Figure 4:
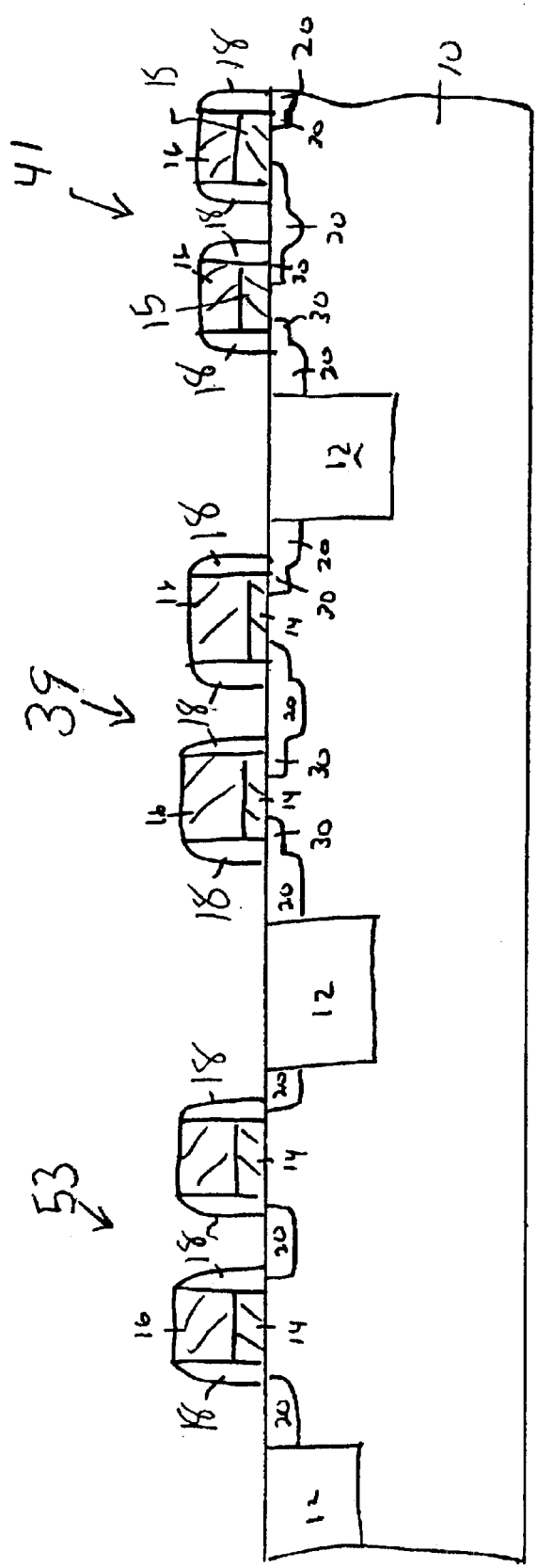
FIG. 4 is a pictorial representation of IC chip which includes a set of transistor logic devices, a set of transistor I/O devices, and a set of the inventive underlapped FETs.

FIG. 4 depicts another possible structure in which the inventive underlapped FET device can be used. Specifically, the structure shown in FIG. 4 includes first set of transistor logic devices 39 that operate at a first supply voltage, a second set of transistor input/output (I/O) devices 41 that operate at a second supply voltage that is greater than the first supply voltage, and a third set of transistor programmable devices 53 that are programmed at the second supply voltage. The transition I/O devices are similar to the transistor logic devices except that the gate dielectric for the I/O is generally thicker than the gate dielectric for logic devices. Note that the third set of transistor programmable devices includes a plurality of the inventive underlapped FET devices depicted in FIG. 1. Note that in this drawing reference numeral 15 denotes the thicker gate dielectric regions for the I/O devices.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. An integrated circuit chip comprising:
a first set of field effect transistors (FETs) having a first source-to-drain resistance and a second set of FETs having underlapped source/drain regions and a second source-to-drain resistance, wherein said second source-to-drain resistance is at least 50% greater than said first source-to-drain resistance and said second set of FETs is programmable.

2. The integrated circuit chip of claim 1 wherein said first set of FETs comprises a plurality of FETs in which extension implants are present.

3. The integrated circuit chip of claim 1 wherein said source/drain regions of said second set of FETs are separated by a channel region, and a gate region is present atop a portion of said channel region.

4. The integrated circuit chip of claim 3 wherein said gate region includes at least a gate dielectric and a gate conductor, said gate conductor being located atop said gate dielectric.

5. The integrated circuit chip of claim 3 further comprising insulator spacers located on exposed sidewalls of said gate region.

6. The integrated circuit chip of claim 5 wherein during programming, charge is trapped within said insulator spacers.

7. The integrated circuit chip of claim 1 wherein said second source-to-drain resistance is approximately 100% greater than the first source-to-drain resistance.

8. The integrated circuit chip of claim 1 wherein said second set of FETs is programmed by hot-electron injection.

9. The integrated circuit chip of claim 1 wherein said second set of FETs is programmable at a voltage of less than about 5 V.

* * * * *